US012805213B2

(12) United States Patent
Cheng

(10) Patent No.: US 12,805,213 B2

(45) Date of Patent: Nov. 17, 2026

(54) SEMICONDUCTOR STRUCTURE AND MANUFACTURING METHOD THEREFOR

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 647 days.

(21) Appl. No.: 18/071,910

(22) Filed: Nov. 30, 2022

(65) Prior Publication Data

US 2023/0089919 A1 Mar. 23, 2023

Related U.S. Application Data

(63) Continuation of application No. PCT/CN2020/123259, filed on Oct. 23, 2020.

(51) Int. Cl.

*H10P 14/20* (2026.01)
*C30B 25/04* (2006.01)

(Continued)

(52) U.S. Cl.

CPC .......... *H10P 14/3256* (2026.01); *C30B 25/04* (2013.01); *C30B 25/186* (2013.01);

(Continued)

(58) Field of Classification Search

CPC ........... H01L 21/02513; H01L 21/0242; H01L 21/02458; H01L 21/02507; H01L 21/0254; H01L 21/02579; H01L 21/0262; H01L 21/02645; H01L 21/02505; H01L 21/0265; H01L 21/02; C30B 25/04; C30B 25/186; C30B 29/403; C30B 29/68; H10D 62/8164; H10D 62/8503; H10P 14/3256;

(Continued)

(56) References Cited

U.S. PATENT DOCUMENTS

| | | | | |
|---|---|---|---|---|
| 6,555,846 B1 * | 4/2003 | Watanabe | H01L 21/02579 257/190 |
| 7,915,626 B1 * | 3/2011 | Allerman | H01L 21/0262 257/95 |

(Continued)

FOREIGN PATENT DOCUMENTS

| | | |
|---|---|---|
| CN | 101390201 A | 3/2009 |
| CN | 105140351 A | 12/2015 |

(Continued)

OTHER PUBLICATIONS

First Office Action issued in counterpart Chinese Patent Application No. 202080105360.1, dated Mar. 26, 2025.

(Continued)

*Primary Examiner* — William B Partridge
*Assistant Examiner* — Erik A. Anderson
(74) *Attorney, Agent, or Firm* — Westbridge IP LLC

(57) ABSTRACT

Disclosed are a semiconductor structure and a manufacturing method therefor, solving a problem that a surface of an epitaxial layer is not easy to flatten as the epitaxial layer has a large stress. The semiconductor structure includes: a substrate; a patterned AlN/AlGaN seed layer on the substrate; and an AlGaN epitaxial layer formed on the patterned AlN/AlGaN seed layer.

12 Claims, 3 Drawing Sheets

(51) Int. Cl.

| | |
|---|---|
| ***C30B 25/18*** | (2006.01) |
| ***C30B 29/40*** | (2006.01) |
| ***C30B 29/68*** | (2006.01) |
| ***H10D 62/815*** | (2025.01) |
| ***H10P 14/24*** | (2026.01) |

(52) U.S. Cl.
CPC ............ *C30B 29/403* (2013.01); *C30B 29/68* (2013.01); *H10D 62/8164* (2025.01); *H10P 14/24* (2026.01); *H10P 14/274* (2026.01); *H10P 14/2921* (2026.01); *H10P 14/3216* (2026.01); *H10P 14/3252* (2026.01); *H10P 14/3416* (2026.01); *H10P 14/3444* (2026.01)

(58) Field of Classification Search
CPC .... H10P 14/24; H10P 14/274; H10P 14/2921; H10P 14/3216; H10P 14/3252; H10P 14/3416; H10P 14/3444
See application file for complete search history.

(56) References Cited

U.S. PATENT DOCUMENTS

| | | | | |
|---|---|---|---|---|
| 8,349,633 | B1 | 1/2013 | Allerman et al. | |
| 8,796,738 | B2 * | 8/2014 | Briere | H01L 21/0237 257/E29.247 |
| 2004/0155248 | A1 * | 8/2004 | Fukuda | H10H 20/816 257/94 |
| 2014/0001439 | A1 * | 1/2014 | Chen | H10D 62/8503 257/E29.091 |
| 2015/0079770 | A1 * | 3/2015 | Wierer, Jr. | H01L 21/02433 977/890 |
| 2015/0255677 | A1 * | 9/2015 | Dechoux | H10F 77/1437 438/93 |
| 2016/0322225 | A1 * | 11/2016 | Chen | H01L 21/0251 |
| 2018/0323071 | A1 * | 11/2018 | Shatalov | H01L 21/0262 |

FOREIGN PATENT DOCUMENTS

| | | | |
|---|---|---|---|
| CN | 106350783 | A | 1/2017 |
| CN | 107546302 | A | 1/2018 |
| CN | 108133993 | A | 6/2018 |
| CN | 108231881 | A | 6/2018 |
| CN | 111244234 | A | 6/2020 |
| CN | 111710594 | A | 9/2020 |

OTHER PUBLICATIONS

International Search Report issued in corresponding PCT Application No. PCT/CN2020/123259, dated Jul. 21, 2021.

* cited by examiner

SEMICONDUCTOR STRUCTURE AND MANUFACTURING METHOD THEREFOR

CROSS-REFERENCE TO RELATED APPLICATIONS

This application is a continuation of International Application No. PCT/CN2020/123259, filed on Oct. 23, 2020, the disclosure of which is hereby incorporated by reference in its entirety.

TECHNICAL FIELD

The present disclosure relates to the technical field of semiconductors, and in particular, to a semiconductor structure and a manufacturing method therefor.

BACKGROUND

Nano-scale patterned sapphire substrate (nPSS) technology is a relatively mature technical solution in the field of growing gallium nitride material on a heterogeneous-substrate. The preparation process includes: growing an aluminum nitride template on a nPSS substrate; after healing, regrowing AlGaN material. In this case, the stress in AlGaN is relatively large, so that the surface is not easy to flatten.

SUMMARY

In view of this, the present disclosure provides a semiconductor structure and a manufacturing method therefor, which solve a problem that a surface of an epitaxial layer is not easy to flatten as the epitaxial layer of the semiconductor structure has a large stress.

A first aspect of the present disclosure provides a semiconductor structure, including a substrate; a patterned AlN/AlGaN seed layer on the substrate; and an AlGaN epitaxial layer formed on the patterned AlN/AlGaN seed layer.

In an embodiment, the patterned AlN/AlGaN seed layer includes a first AN layer, an $Al_xGa_{1-x}N$ layer and a second AN layer stacked in sequence, and the second AN layer has a patterned structure; $x<0.5$.

In an embodiment, the patterned AlN/AlGaN seed layer is a superlattice structure including a patterned AN layer and a patterned AlGaN layer stacked alternately, and the superlattice structure is arranged between the substrate and the AlGaN epitaxial layer.

In an embodiment, the superlattice structure further includes a film layer, and a material of the film layer is different from AN and AlGaN.

In an embodiment, the material of the film layer is GaN.

In an embodiment, the patterned AlN/AlGaN seed layer includes a first AN layer and a superlattice structure including a patterned AN layer and a patterned AlGaN layer stacked alternately.

In an embodiment, the patterned AlN/AlGaN seed layer includes an $Al_xGa_{1-x}N$ layer in which Al composition decreases from the substrate toward the AlGaN epitaxial layer, where $0.55 \leq x \leq 1$.

In an embodiment, the AlGaN epitaxial layer includes impurities.

In an embodiment, the impurities include In element or Mg element.

In an embodiment, a patterning depth in a thickness direction of the patterned AlN/AlGaN seed layer is less than or equal to a thickness of the patterned AlN/AlGaN seed layer.

A second aspect of the present disclosure provides a method for manufacturing a semiconductor structure, including: growing a patterned AlN/AlGaN seed layer on a substrate; and growing an epitaxial layer on the patterned AlN/AlGaN seed layer.

In an embodiment, the growing a patterned AlN/AlGaN seed layer on the substrate includes: growing an AlN/AlGaN seed layer of a flat sheet structure on a substrate of a flat sheet structure; and etching the AlN/AlGaN seed layer to obtain the patterned AlN/AlGaN seed layer.

In an embodiment, the growing a patterned AlN/AlGaN seed layer on a substrate includes: growing an AlN/AlGaN seed layer of an island structure on a substrate of a flat sheet structure; stopping a growth of the AlN/AlGaN seed layer to obtain the patterned AlN/AlGaN seed layer before the AlN/AlGaN seed layer of the island structure fails to heal to form the AlN/AlGaN seed layer of a flat sheet structure.

DETAILED DESCRIPTION OF THE EMBODIMENTS

In order to make the objectives, technical solution and advantages of the present disclosure clearer, the present disclosure will be further described in detail below with reference to the accompanying drawings.

Figure 1A:
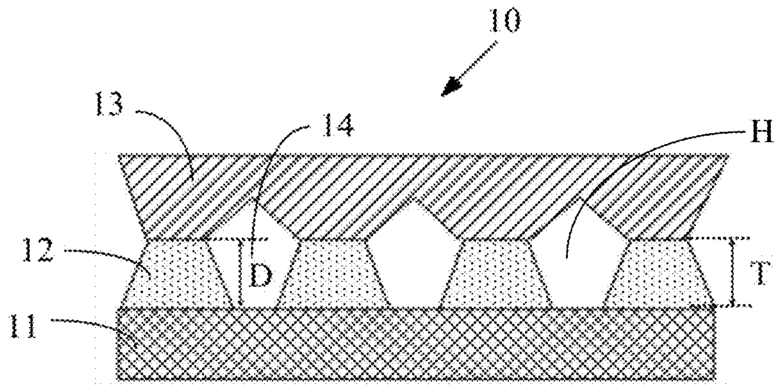
FIG. 1*a* is a schematic diagram of a semiconductor structure provided by an embodiment of the present disclosure.
Figure 1B:
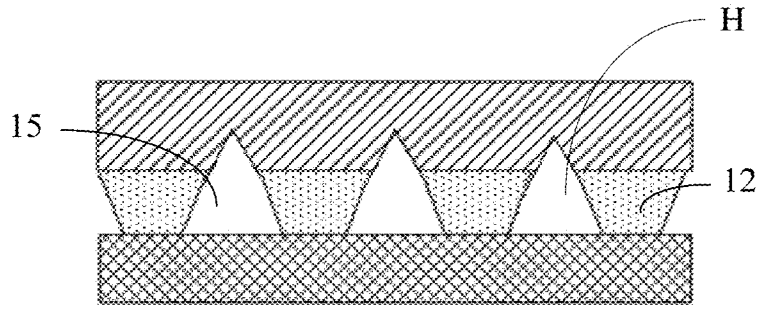
FIG. 1B is a schematic diagram of a semiconductor structure provided by another embodiment of the present disclosure.

FIG. 1*a* is a schematic diagram of a semiconductor structure 10 provided by an embodiment of the present disclosure. FIG. 1B is a schematic diagram of the semiconductor structure provided by another embodiment of the present disclosure. As shown in FIG. 1*a* and FIG. 1B, the semiconductor structure 10 includes a substrate 11 and a patterned AlN/AlGaN seed layer 12, and the patterned AlN/AlGaN seed layer 12 is arranged on the substrate 11. The semiconductor structure 10 further includes an AlGaN epitaxial layer 13 formed on the patterned AlN/AlGaN seed layer 12.

An AlN/AlGaN seed layer refers to a seed layer including materials of AN and AlGaN. For example, the seed layer may be a single layer structure formed by mixing AN and AlGaN materials, or may be a composite layer structure formed by stacking AlN layers and AlGaN layers. When the seed layer is a composite layer structure formed by stacking AlN layers and AlGaN layers, a number and a positional relationship between the AlN layer and the AlGaN layer may be arbitrary.

The patterned AlN/AlGaN seed layer 12 refers to a AlN/AlGaN seed layer with a patterned structure, and for example, the patterned structure may be obtained by etching or by patterned growth. In an embodiment, the patterned structure of the patterned AlN/AlGaN seed layer 12 is obtained by etching. In this case, as shown in FIG. 1*a*, a cross section of the patterned AlN/AlGaN seed layer 12 in a direction perpendicular to its thickness includes inverted trapezoidal grooves 14. In another embodiment, as shown in FIG. 1B, the patterned structure of the AlN/AlGaN seed layer is obtained by patterned growth. In this case, the cross section of the patterned AlN/AlGaN seed layer 12 in a direction perpendicular to its thickness includes regular trapezoidal grooves 15.

Figure 2:
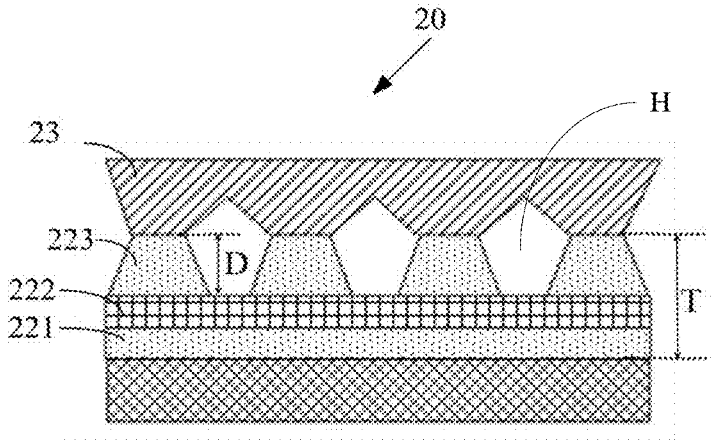
FIG. 2 is a schematic diagram of a semiconductor structure provided by still another embodiment of the present disclosure.

In a thickness direction of the seed layer, a patterning depth D may penetrate through the seed layer or terminate within the seed layer. As shown in FIG. 1*a*, a patterning depth D in the thickness direction of the patterned AlN/AlGaN seed layer 12 is less than a thickness T of the patterned AlN/AlGaN seed layer 12. As shown in FIG. 2, a patterning depth D in a thickness direction of the patterned AlN/AlGaN seed layer is equal to a thickness T of the patterned AlN/AlGaN seed layer. Due to the existence of the patterned structure, a plurality of openings H are formed on the surface of the patterned AlN/AlGaN seed layer 12 close to the AlGaN epitaxial layer 13, and the area of the AlGaN epitaxial layer 13 over the plurality of openings H is in a suspended state without being supported by the patterned AlN/AlGaN seed layer 12.

Understandably, a specific shape of the patterned structure may be reasonably selected according to actual needs.

According to the semiconductor structure provided in the embodiment, the patterned AlN/AlGaN seed layer 12 includes holes in contact with the AlGaN epitaxial layer 13. In this case, the AlGaN epitaxial layer 13 arranged on the seed layer may use the holes in the patterned AlN/AlGaN seed layer 12 to release stress, thereby reducing the risk that the epitaxial layer is not easy to flatten caused by stress concentration and increasing flatness of the AlGaN epitaxial layer 13.

In an embodiment, the AlGaN epitaxial layer 13 includes impurities. The impurities in the AlGaN epitaxial layer 13 includes, for example, In element or Mg element. By incorporating the impurities into the epitaxial layer, the healing of the AlGaN epitaxial layer 13 may be promoted, thereby further improving the flatness of the AlGaN epitaxial layer 13.

FIG. 2 is a schematic diagram of a semiconductor structure provided by another embodiment of the present disclosure. As shown in FIG. 2, in this embodiment, a seed layer in a semiconductor structure 20 includes a first AlN layer 221, an $Al_xGa_{1-x}N$ (x<0.5) layer 222 and a second AlN layer 223 stacked in sequence. The second AlN layer 223 has a patterned structure.

A patterning depth of the second AlN layer 223 may penetrate the second AlN layer 223, or may terminate within the second AlN layer 223. The epitaxial layer 23 is stacked on the second AlN layer 223, and the patterned structure of the second AlN layer 223 can release stress concentrated in the epitaxial layer 23, thereby improving flatness of the epitaxial layer 23.

Furthermore, in this embodiment, the seed layer includes a sandwich structure in which the $Al_xGa_{1-x}N$ (x<0.5) layer is sandwiched between two AlN layers. Since the AlN layers and the $Al_xGa_{1-x}N$(x<0.5) layer have different absorption efficiencies for laser light, the $Al_xGa_{1-x}N$ (x<0.5) layer may be decomposed by laser light which is of a suitable wavelength selected to achieve substrate peeling.

In an embodiment, the whole of the $Al_xGa_{1-x}N$ (x<0.5) layer 222 and the second AlN layer 223 has a patterned structure, and the depth of the patterned structure penetrates through the $Al_xGa_{1-x}N$ (x<0.5) layer 222 and the second AlN layer 223, or terminates within the $Al_xGa_{1-x}N$ (x<0.5) layer 222. In another embodiment, the whole of the first AlN layer 221, the $Al_xGa_{1-x}N$ (x<0.5) layer 222 and the second AlN layer 223 has a patterned structure, and the depth of the patterned structure penetrates through the first AlN layer 221 and the $Al_xGa_{1-x}N$ (x<0.5) layer 222 and second AlN layer 223, or terminate within the first AlN layer 221. In this way, the depth of grooves is extended, the stress release effect is improved, and the flatness of the epitaxial layer 23 is further improved.

Figure 3:
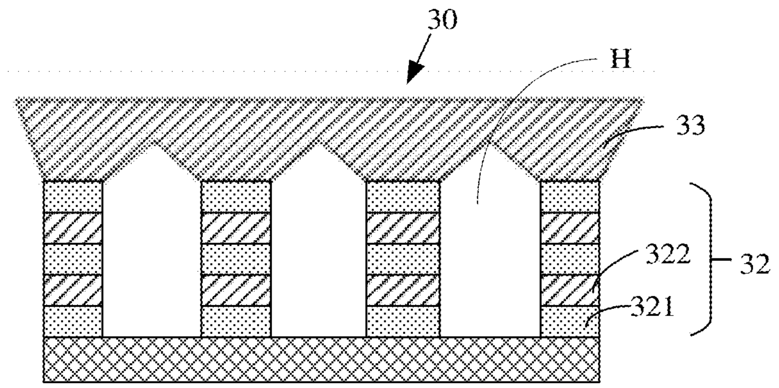
FIG. 3 is a schematic diagram of a semiconductor structure provided by yet still another embodiment of the present disclosure.

FIG. 3 is a schematic diagram of a semiconductor structure according to still another embodiment of the present disclosure. As shown in FIG. 3, in this embodiment, the AlN/AlGaN seed layer 32 in the semiconductor structure 30 is a superlattice structure formed by alternately stacking patterned AlN layer 321 and patterned AlGaN layer 322, and the patterning depth penetrates through the superlattice structure, or terminates in the AlN layer 321 inside the superlattice structure, or terminates in the AlGaN layer 322 inside the superlattice structure.

AlN and AlGaN have different lattice constants, so the superlattice structure formed by alternately stacking the AlN layers 321 and the AlGaN layers 322 may relax stress in a growth plane and filter dislocations effectively to ensure uniformity of the thickness and performance of the epitaxial layer 33.

The stacked AlN layers 321 and AlGaN layers 322 are alternating layers in the superlattice structure and the superlattice structure includes at least one pair of the alternating layers.

The thickness of the AlN layer 321 and the thickness of the AlGaN layer 322 are the same or different. The thicknesses of the AlN layers 321 in different alternating layers are the same or different, and the thicknesses of the AlGaN layers 322 in different alternating layers are the same or different.

In an embodiment, the superlattice structure may further include a film layer formed of a third material, and the film layer formed of the third material may provide compressive stress, tensile stress, or may be a neutral layer. The film layer formed of the third material may be added to the alternating layers composed by the AN layer 321 and the AlGaN layer 322 in a way of arbitrary arrangement and combination to form a new superlattice structure. For an example, taking GaN as the third material, the superlattice structure includes the AlN layer 321, the AlGaN layer 322 and a GaN layer stacked in sequence, or the superlattice structure includes the AlN layer 321, the GaN layer and the AlGaN layer 322 stacked in sequence, or the superlattice structure includes the GaN layer, the AlN layer 321, the AlGaN layer 322 stacked in sequence.

Figure 4:
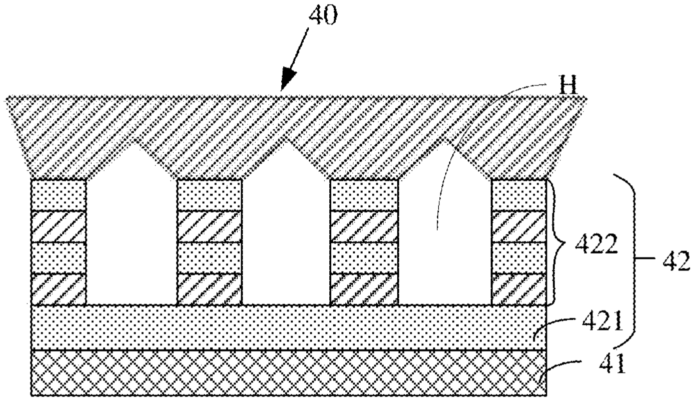
FIG. 4 is a schematic diagram of a semiconductor structure provided by yet still another embodiment of the present disclosure.

FIG. 4 is a schematic diagram of a semiconductor structure according to yet still another embodiment of the present disclosure. As shown in FIG. 4, in this embodiment, a seed layer 42 in a semiconductor structure 40 includes a first AlN layer 421 and a superlattice structure 422 formed by alternately stacking patterned AlN layers and patterned AlGaN layers. The first AlN layer 421 is a flat layer structure, which is directly grown on the substrate 41. The superlattice structure here is the same as the superlattice structure in the semiconductor structure 30 shown in FIG. 3, and details are not described here.

Figure 5:
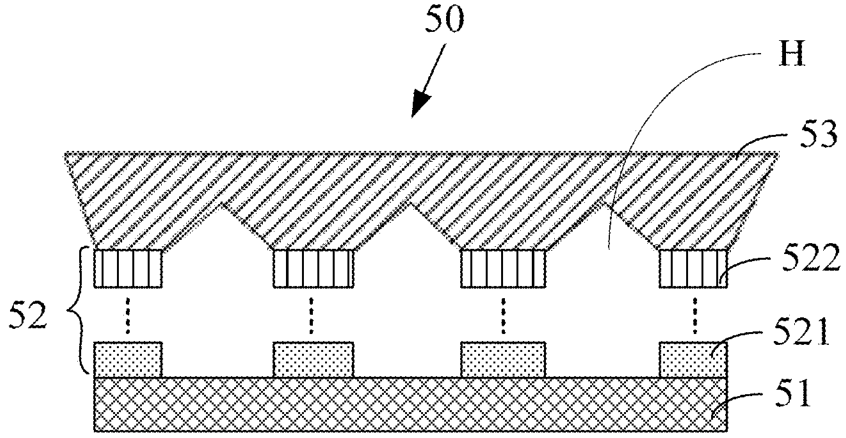
FIG. 5 is a schematic diagram of a semiconductor structure provided by yet still another embodiment of the present disclosure.

FIG. 5 is a schematic diagram of a semiconductor structure according to yet still another embodiment of the present disclosure. As shown in FIG. 5, in this embodiment, a patterned AlN/AlGaN seed layer in the semiconductor structure 50 includes an $Al_xGa_{1-x}N$ layer whose Al composition decreases in a direction from a substrate 51 to a epitaxial layer 53, wherein $0.55 \le x \le 1$, that is, the patterned AlN/AlGaN seed layer includes a transition layer 52 transitioning from an AlN layer 521 to an $Al_{0.55}Ga_{0.45}N$ layer 522, and a patterning depth penetrates through the transition layer 52 or terminates inside the transition layer 52.

According to the semiconductor structure 50 provided in this embodiment, by arranging the transition layer 52 in the seed layer, the transition layer 52 may effectively reduce a dislocation density of the epitaxial layer 53, which is beneficial to improve flatness of the epitaxial layer 53.

Figure 6:
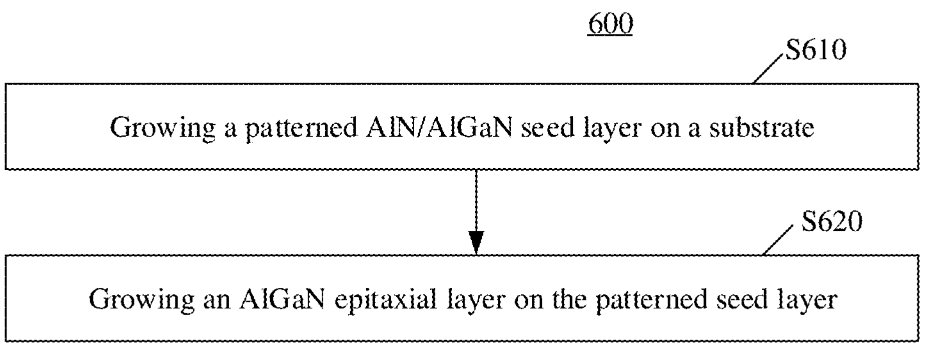
FIG. 6 is a flowchart of a method for manufacturing a semiconductor structure according to an embodiment of the present disclosure.

The present disclosure also provides a manufacturing method for a semiconductor structure. FIG. 6 is a flowchart of a method for manufacturing a semiconductor structure provided by an embodiment of the present disclosure. This manufacturing method can be used to manufacture the semiconductor structure provided in any of the above embodiments. As shown in FIG. 6, the manufacturing method 600 for the semiconductor structure includes the following steps.

Step S610, growing a patterned AlN/AlGaN seed layer on a substrate.

In an embodiment, step S610 is specifically executed as: growing an AlN/AlGaN seed layer of a flat sheet structure on a substrate of a flat sheet structure; and etching the AlN/AlGaN seed layer to obtain the patterned AlN/AlGaN seed layer.

For example, a sapphire substrate of a flat sheet structure is put in a reaction chamber of MOCVD equipment, hydrogen ($H_2$) or nitrogen ($N_2$) are feed in as carrier gas, and trimethylgallium (TMGa), trimethylaluminum (TMAl) and ammonia ($NH_3$) are used as Ga, Al and N sources respectively to grow a AlN/AlGaN seed layer of a flat sheet structure. A epitaxial layer is taken out from the reaction chamber of the MOCVD equipment, and an etching barrier layer is formed on the seed layer; the etching barrier layer is patterned to expose part of the seed layer. A surface exposing the seed layer is placed in an etching machine with $Cl_2$ gas, and a bias voltage is applied to etch the seed layer to a specified depth to form a patterned seed layer. A wet etching method may also be adopted in the step of etching the seed layer, for example, the surface exposing the seed layer is placed in a $H_3PO_4$ solution to etch the seed layer to a specified depth, thereby forming the patterned seed layer.

The material of the etching barrier layer is photoresist, or metal hard mask, or dielectric hard mask, and preferably silicon nitride is used as the etching barrier layer. The etching machine may be an inductively coupled plasma etching machine.

In another embodiment, step S610 is specifically executed as: referring to FIG. 1B, growing an AlN/AlGaN seed layer of an island structure on a substrate of a flat sheet structure; stopping a growth of the AlN/AlGaN seed layer to obtain the patterned AlN/AlGaN seed layer before the AlN/AlGaN seed layer of the island structure is not healed to form the AlN/AlGaN seed layer of a flat sheet structure. Compared with the previous embodiment, this embodiment omits the step of etching the seed layer, which simplifies the manufacturing process.

It should be noted that grooves with an inverted trapezoidal cross-section are formed on the patterned seed layer obtained by etching, while grooves with a normal trapezoidal cross-section are formed on the patterned seed layer obtained by patterned growth.

Step S620, growing an AlGaN epitaxial layer on the patterned seed layer.

Specifically, an epitaxial wafer containing the patterned seed layer is put in the reaction chamber of the MOCVD equipment again, and the AlGaN epitaxial layer is grown on the seed layer.

According to the manufacturing method for the semiconductor structure provided by any of the above embodiments, the semiconductor structure provided by any of the above embodiments may be obtained, and has technical effects corresponding to the semiconductor structure, which will not be repeated here.

According to the semiconductor structure and the manufacturing method therefor provided by the present disclosure, the seed layer has a patterned structure, and holes in contact with the epitaxial layer is formed in the patterned structure. In this case, the epitaxial layer on the seed layer may use release stress through the holes in the seed layer, thereby reducing a risk that the epitaxial layer is not easy to flatten due to stress concentration, and improving flatness of the epitaxial layer.

The above descriptions are only preferred embodiments of the present disclosure, and are not intended to limit the present disclosure. Any modifications, equivalent replacements made within the spirit and principles of the present disclosure shall be included in the protection scope of the present disclosure.

What is claimed is:

1. A semiconductor structure, comprising:
a substrate, the substrate being a flat sheet structure;
a patterned AlN/AlGaN seed layer arranged on the substrate; and
an AlGaN epitaxial layer formed on the patterned AlN/AlGaN seed layer;
wherein the patterned AlN/AlGaN seed layer comprises a first AlN layer, an $Al_xGa_{1-x}N$ layer and a second AlN layer stacked in sequence; wherein $x<0.5$; a side, facing the AlGaN epitaxial layer, of the patterned AlN/AlGaN seed layer is provided with a plurality of openings, an area of the AlGaN epitaxial layer over the plurality of openings is unsupported by a surface of the patterned AlN/AlGaN seed layer, and the plurality of openings penetrate through the first AlN layer, the $Al_xGa_{1-x}N$ layer and the second AlN layer, or terminate within the first AlN layer.

2. The semiconductor structure according to claim 1, wherein the AlGaN epitaxial layer comprises impurities.

3. The semiconductor structure according to claim 2, wherein the impurities comprise an In element or an Mg element.

4. The semiconductor structure according to claim 1, wherein a patterning depth in a thickness direction of the patterned AlN/AlGaN seed layer is less than or equal to a thickness of the patterned AlN/AlGaN seed layer.

5. A method for manufacturing a semiconductor structure, comprising:
growing a patterned AlN/AlGaN seed layer on a substrate of a flat sheet structure; and
growing an AlGaN epitaxial layer on the patterned AlN/AlGaN seed layer;
wherein the patterned AlN/AlGaN seed layer comprises a first AlN layer, an $Al_xGa_{1-x}N$ layer and a second AlN layer stacked in sequence; wherein x<0.5, a side, facing the AlGaN epitaxial layer, of the patterned AlN/AlGaN seed layer is provided with a plurality of openings, an area of the AlGaN epitaxial layer over the plurality of openings is unsupported by a surface of the patterned AlN/AlGaN seed layer, and the plurality of openings penetrate through the first AlN layer, the $Al_xGa_{1-x}N$ layer and the second AlN layer, or terminate within the first AlN layer.

6. The method for manufacturing a semiconductor structure according to claim 5, wherein the growing the patterned AlN/AlGaN seed layer on the substrate comprises:

growing an AlN/AlGaN seed layer of a flat sheet structure on the substrate of the flat sheet structure; and etching the AlN/AlGaN seed layer to obtain the patterned AlN/AlGaN seed layer.

7. The method for manufacturing a semiconductor structure according to claim 5, wherein the growing the patterned AlN/AlGaN seed layer on the substrate comprises:

growing an island-structured AlN/AlGaN seed layer on the substrate of the flat sheet structure; and stopping a growth of the island-structured AlN/AlGaN seed layer to obtain the patterned AlN/AlGaN seed layer before the island-structured AlN/AlGaN seed layer coalesces to form a flat-sheet-structured AlN/AlGaN seed layer.

8. The semiconductor structure according to claim 1, wherein a shape of cross-sections of the plurality of openings is an inverted trapezoid along a thickness direction of the patterned AlN/AlGaN seed layer.

9. A semiconductor structure, comprising:

a substrate, the substrate being a flat sheet structure;

a patterned AlN/AlGaN seed layer arranged on the substrate; and an AlGaN epitaxial layer formed on the patterned AlN/AlGaN seed layer;

wherein the patterned AlN/AlGaN seed layer is a superlattice structure comprising a patterned AlN layer and a patterned AlGaN layer stacked alternately, and the superlattice structure is arranged between the substrate and the AlGaN epitaxial layer; a side, facing the AlGaN epitaxial layer, of the patterned AlN/AlGaN seed layer is provided with a plurality of openings, an area of the AlGaN epitaxial layer over the plurality of openings is unsupported by a surface of the patterned AlN/AlGaN seed layer, and the plurality of openings penetrate through the superlattice structure, or terminate within the superlattice structure.

10. The semiconductor structure according to claim 9, wherein the superlattice structure further comprises a film layer, and a material of the film layer is different from AlN and AlGaN.

11. The semiconductor structure according to claim 9, wherein the material of the film layer is GaN.

12. The semiconductor structure according to claim 9, further comprising a first AlN layer of a flat sheet structure grown on the substrate.

* * * * *